(12) United States Patent
Stopa et al.

(10) Patent No.: US 6,641,284 B2
(45) Date of Patent: Nov. 4, 2003

(54) LED LIGHT ASSEMBLY

(75) Inventors: James L. Stopa, Old Saybrook, CT (US); Todd J. Smith, Deep River, CT (US)

(73) Assignee: Whelen Engineering Company, Inc., Chester, CT (US)

( * ) Notice: Subject to any disclaimer, the term of this patent is extended or adjusted under 35 U.S.C. 154(b) by 0 days.

(21) Appl. No.: 10/081,905

(22) Filed: Feb. 21, 2002

(65) Prior Publication Data

US 2003/0156416 A1 Aug. 21, 2003

(51) Int. Cl.⁷ .............................. F21V 9/00; F21V 29/00
(52) U.S. Cl. ...................... 362/240; 362/800; 362/235; 362/245; 362/373; 362/294
(58) Field of Search ................................ 362/235, 800, 362/249, 294, 373, 244, 245, 240, 242, 243

(56) References Cited

U.S. PATENT DOCUMENTS

| | | | | |
|---|---|---|---|---|
| 5,418,384 A | | 5/1995 | Yamana et al. ............... 257/88 |
| 5,813,753 A | | 9/1998 | Vriens et al. ................ 362/293 |
| 5,887,968 A | * | 3/1999 | Logan ........................ 362/241 |
| 6,045,240 A | * | 4/2000 | Hochstein .................... 362/294 |
| 6,158,882 A | | 12/2000 | Bischoff, Jr. ................. 362/488 |
| 6,257,737 B1 | * | 7/2001 | Marshall et al. ............. 362/231 |
| 6,320,182 B1 | * | 11/2001 | Hubble, III et al. ......... 362/327 |
| 6,481,130 B1 | * | 11/2002 | Wu ............................. 362/297 |

OTHER PUBLICATIONS

International Search Report corresponding to International Application No. PCT/US02/25297 dated Mar. 31, 2003.

* cited by examiner

Primary Examiner—Thomas M. Sember
(74) Attorney, Agent, or Firm—Alix, Yale & Ristas, LLP (57) ABSTRACT

An light source utilizes a parabolic reflector to collimate light emitted from at greater than a predetermined angle relative to the optical axis of an LED arranged at the focus of the reflector. An optional collimating lens is arranged to collimate light emitted at less than the predetermined angle. Both variations provide light in the form of a substantially collimated beam. The parabolic reflector is preferably extended along its focal point to form a linear parabolic section having a linear focal axis. A linear array of LEDs is arranged such that the linear focal axis passes through the area of light emission of each LED. The linear parabolic section may be provided with parabolic dish ends. Alternatively, the ends of the parabolic section may be left open for increased wide angle visibility.

23 Claims, 11 Drawing Sheets

LED LIGHT ASSEMBLY

BACKGROUND OF THE INVENTION

1. Field of the Invention

The present invention relates generally to warning light devices, and more particularly to a device for producing integrated directional light from an LED light source.

2. Description of the Related Art

Lights designed to serve illumination, warning or signaling functions must produce light of different intensity, duration and pattern. Within any broad category, such as warning lights, lights designed for a particular application, e.g., aircraft warning lights, may have a very different required intensity and light pattern than a warning light designed for, e.g., an emergency vehicle such as a police car or fire truck.

The prior art contains numerous examples of alternative light sources, reflectors and lenses arranged to produce particular intensities and distributions of light suited for a particular purpose. Of primary concern to designers of lights are efficiency and accuracy. By efficiency, it is meant that lighting designers are concerned with producing the maximum amount of light measured in candelas per unit of energy applied and transforming that light into a useful pattern with minimal losses. The light fixture must also distribute the available light as accurately as possible in the desired pattern. Lenses and other means used for bending and shaping light cause light losses due to differences between the refractive index of the lens material and the air surrounding the lens. Any light that is scattered, i.e., not accurately directed in the desired pattern, is effectively lost by being dispersed.

Until recently, light-emitting diodes (LEDs), while efficient producers of light in terms of candelas per watt of energy used, were extremely limited in the quality of light produced (candela vs. viewing angle), rendering them unsuitable for many applications. The viewing angle is the angle, measured with respect to the axis through the center of the lens of the LED, where the light intensity has fallen to fifty (50%) of the on-axis intensity. For example, a very bright LED, producing 3 to 5 candela may have a very narrow viewing angle of 8 to 15 degrees.

Recent advances in LED technology have resulted in LEDs having significantly improved light output. High-output (high flux) LEDs may now be a practical light source for use in signaling and warning illumination. Even though high-output LEDs have significantly greater luminous flux than previous LEDs, the total luminous flux is still relatively small, e.g., in the range of 5 to 20 candela, but will have a very wide viewing angle of 110 to 160 degrees. Thus, these newer LEDs produce a "half globe" of light in contrast to a directed "spot" of light with the older LEDs. Thus it is necessary to accumulate multiple LEDs in a compact array and externally focus their light output to produce a light source with luminous intensity sufficient for many applications.

LEDs are attractive to lighting designers because the light they produce is typically of a very narrow spectral wavelength, e.g., of a single pure color, such as red, blue, green, amber, etc. In the prior art, to achieve a colored light output, white light was produced and typically filtered through a colored lens or other colored material, such as a colored glass bulb to produce the desired light color. This causes a very large waste of light and the electrical energy used to produce the light, making such prior art devices very inefficient. LEDs are extremely efficient producers of colored light because the particular chemical compound used in the die of the LED, when excited by electrical current, produces a monochromatic band of energy within the visible light spectrum. For example, a red LED will generate a narrow wavelength of light in the visible red spectrum, e.g., 625 nm +/−20 nm. No external color filtering is needed, significantly improving the efficiency of the light source. Further, LEDs are directional light sources. The light produced from an LED is primarily directed along an optical axis through the center of the lens of the LED. However, and in particular with the more recent high-output LEDs, a significant portion of the light is also directed out the sides of the lens of the LED (the above mentioned "half globe"). If the limited light output of an LED is to result in a practical signaling or illuminating device, as much of the light produced by each LED must be captured and directed in the desired light pattern as possible.

U.S. Pat. No. 6,318,886, assigned to the assignee of the present invention, the entire contents of which are hereby incorporated by reference into this specification, describes a high-flux LED assembly in which an array of LEDs are provided with a reflector surrounding each LED. A conical reflecting surface collects and redirects light escaping from the LED at a large angle relative to the LED optical axis. The conical reflectors redirect such "wide angle" light out the face of the assembly, increasing the effective light contribution of each LED. The high-flux LED assembly also discloses connecting the conical reflectors with grooves to improve the wide-angle visibility desirable in a warning or signaling light application. By concentrating a number of high-output LEDs in a relatively small area and reflecting the light produced in a desired pattern, a very efficient and effective signaling and/or warning light is provided.

U.S. Pat. No. 6,318,886 mentioned above discloses an approach using conical reflectors. While the high-flux LED assembly described in the '886 patent has proved successful for its desired application, further efficiencies are possible. The conical reflectors disclosed in the '886 patent redirect light incident upon them out the face of the light assembly over a range of angles where the angle of the escaping light depends on the angular relationship between incident light and the reflecting surface. Such an arrangement, while desirably redirecting light out the front face of the assembly, undesirably does so over a range of angles. Some of the reflected light reinforces light output of the LED. Other light is reflected at random angles that fail to reinforce the light output of the LED and is effectively lost by being dispersed. The light pattern produced is essentially a series of bright points of light having somewhat improved wide-angle visibility due to the grooves connecting the conical reflectors.

It is known in the art to use parabolic reflectors to collimate the light output from prior art light sources such as halogen bulbs or xenon flash tubes. U.S. Pat. Nos. 4,792,717 and 4,886,329, both directed to a wide-angle warning light and both assigned to the assignee of the present invention, disclose the use of a parabolic reflector comprised of a linear parabolic section including parabolic dish ends. The reflector is configured with a reflector having a linear focal axis similar in configuration to the extended length of the xenon flash tube light source.

As exemplified by the '886, '717 and '329 patents discussed above, reflectors for light assemblies are typically configured to complement the form of the light source, e.g., point light sources are provided with reflectors having axial symmetry and linear light sources are provided with reflectors having linear symmetry. The conventional approach generally involved matching the reflector to the light source to produce maximum light output from a light assembly.

SUMMARY OF THE INVENTION

Briefly stated, the present invention in a preferred form utilizes a linear array of equidistantly spaced point source LEDs arranged along the focal axis of a parabolic reflector having a linear parabolic section to produce a versatile light source whose output is primarily in the form of directional or collimated light. The linear parabolic reflector may comprise parabolic dish ends to form a light source whose output is in the form of a discrete bar of directional light. Alternatively, the linear parabolic reflector may be open at one or both ends to permit assembly into extended-length light sources. Parabolic dish ends may be omitted for the alternative purpose of improving wide-angle visibility if so desired.

A linear array of point source LEDs has a number of advantages over the prior art light sources, including efficiency, primarily collimated light output, pure color light output and durability. Additionally, a linear LED array in accordance with the present invention can be produced in any desired length.

In accordance with the present invention, a linear array of high-output LEDs is arranged on a printed circuit board (PC board). The PC board is then mounted such that each LED in the array is positioned along the linear focal axis of a reflector having a linear parabolic section. This may require a linear parabolic reflector with a slot-like opening adjacent the focal axis of the parabolic section. A reflector in accordance with the present invention is arranged to redirect "wide angle" light (light emitted at a large angle relative, to the optical axis of the LED) so that such light emerges from the reflector in a plane parallel to the optical axes of the LEDs. Even though the LEDs are distinct point light sources, the parabolic reflector combines the overlapping "wide angle" light of adjacent LEDs such that the light output from the assembly is substantially uniform, rather than closely spaced points of light, as would be expected.

For a variety of reasons, at least some of the light emitted at a small angle relative to the optical axis of an LED is not collimated. In accordance with another aspect of the invention, a collimating lens is arranged to redirect light output of the LED that would otherwise miss the parabolic reflector. Such a lens may be a simple convex flat lens or may be a Fresnel lens. In a manner similar to that of the lens on a lighthouse, light entering the collimating lens is refracted into a plane generally parallel to a plane including the optical axes of the LEDs. The collimating lens redirects light that would otherwise not contribute to the effective light output of the LED light assembly.

The combination of LED light sources, a parabolic reflector and a further collimating lens arranged adjacent the optical axes of the LEDs results in a light assembly from which substantially all of the light output is transmitted in the form of an organized wide angle beam. The wide angle beam can then be focused and/or spread to suit the desired application. A precisely configured beam such as that produced from the inventive arrangement results in a very precisely defined light pattern with little or no scattered light.

An object of the present invention is to provide a new and improved LED light assembly whose light output is primarily in the form of a wide angle beam.

Another object of the present invention is to provide a new and improved LED light assembly that efficiently integrates the light output of a plurality of point source LEDs into a substantially uniform light pattern.

A further object of the present invention is to provide a new and improved LED light assembly which efficiently uses a high-output LED to produce highly favorable illumination characteristics.

BRIEF DESCRIPTION OF THE DRAWINGS

These and other objects, features and advantages of the present invention will become readily apparent to those skilled in the art upon reading the description of the preferred embodiments, in conjunction with the accompanying drawings in which.

DETAILED DESCRIPTION OF THE PREFERRED EMBODIMENT

Figure 1:
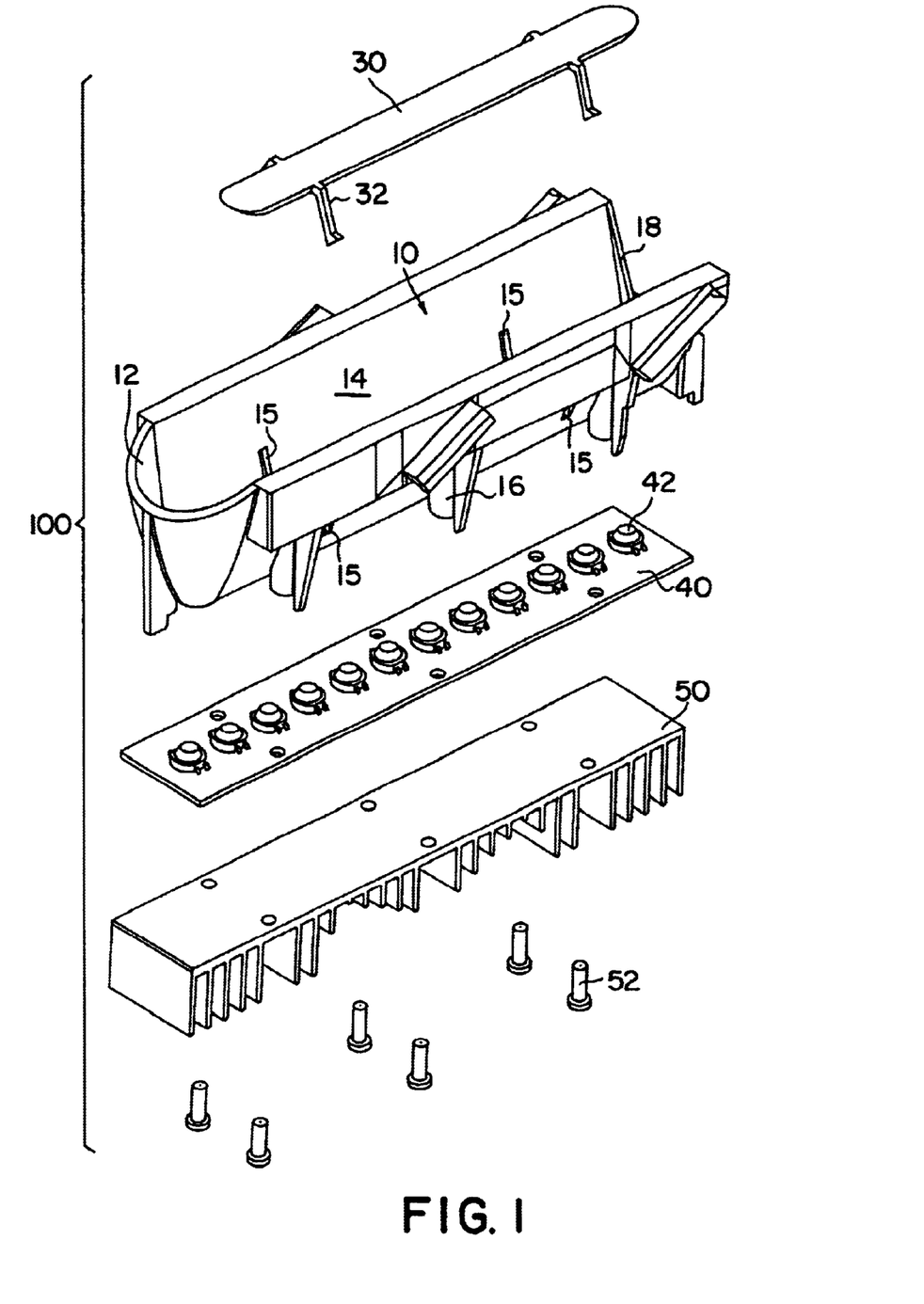
FIG. 1 is an exploded perspective view of a first embodiment of an LED light assembly in accordance with the present invention.

With reference to the drawings, wherein like numerals represent like parts throughout the several figures, a first illustrated embodiment of the LED light assembly in accordance with the present invention is illustrated in FIGS. 1–6. FIG. 1 is an exploded view of an LED light assembly 100 in accordance with the present invention. The LED light assembly 100 includes a reflector 10 having a linear parabolic section 14, a PC board 40 with a plurality of high-output LEDs 42 arranged in a linear array and a heat sink 50 configured for assembly adjacent the rear side of the PC board. Fasteners 52 pass through the heat sink 50 and PC board 40 to engage fastener receptacles 16 molded in the reflector 10. An optional collimating lens 30 is also illustrated. The collimating lens 30 includes attachment legs 32 configured to mate with grooves 15 in the reflector 10. The lens 30 is configured to snap into the reflector and be fixed relative to the reflector 10 and LEDs mounted thereto.

Figure 2:
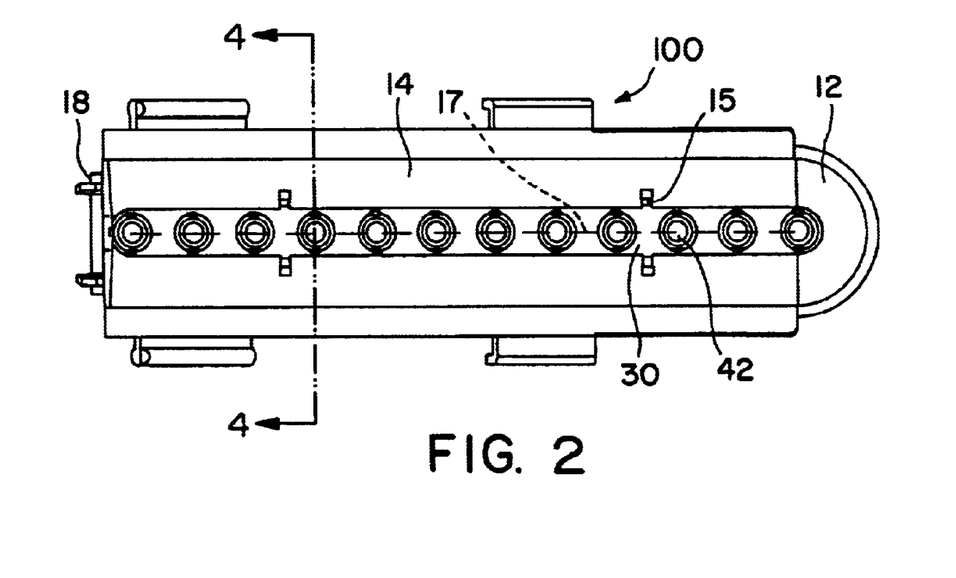
FIG. 2 is a front view of the LED light assembly of FIG. 1 after assembly and upon being rotated 180°.
Figure 3:
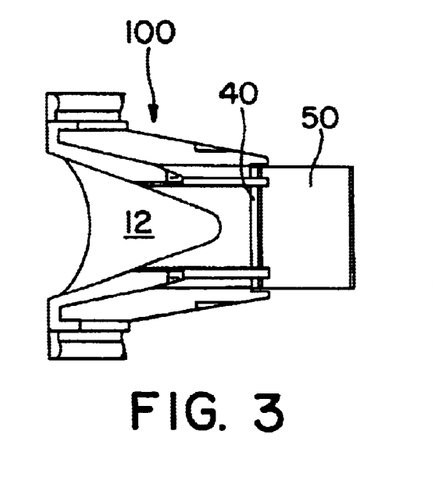
FIG. 3 is a right end view of the LED light assembly of FIG. 2.
Figure 4:
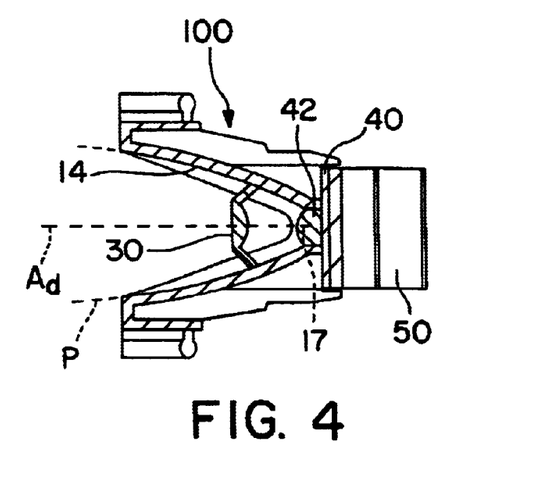
FIG. 4 is a sectional view through the LED light assembly of FIG. 2 taken along the line 4—4 thereof.
Figure 5:
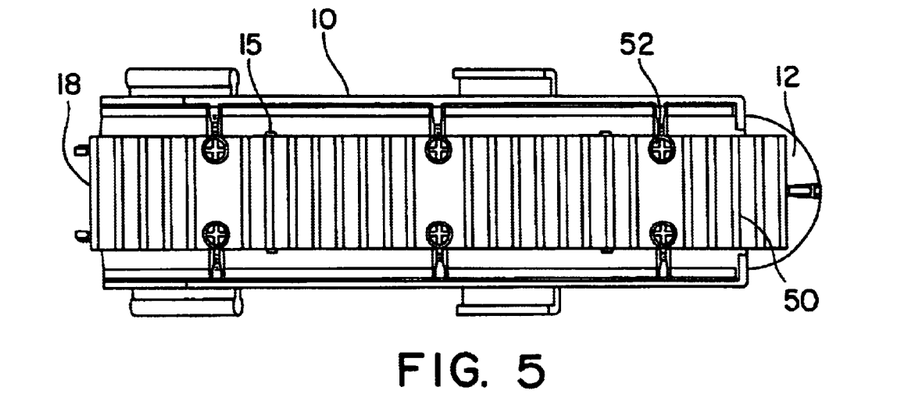
FIG. 5 is a rear view of the LED light assembly of FIG. 2.
Figure 6:
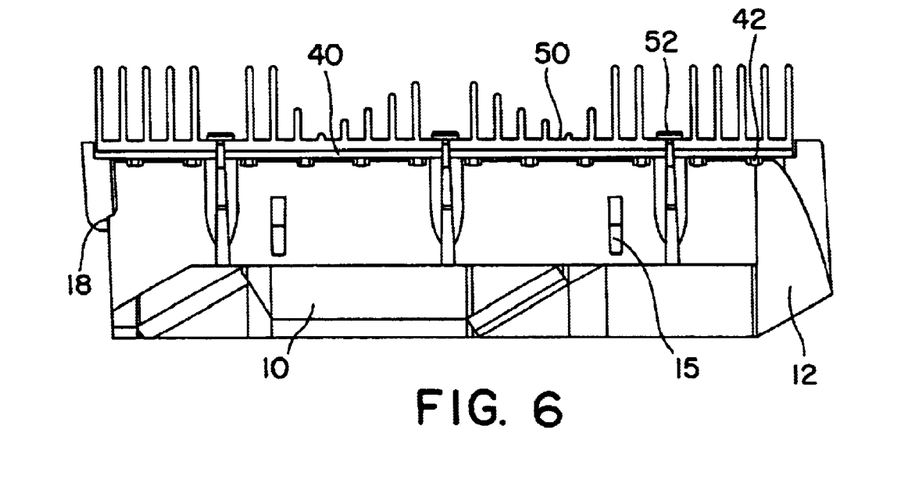
FIG. 6 is a top exterior view of the LED light assembly of FIG. 2.

The reflector 10 has a linear parabolic section 14 that defines a linear focal axis 17 extending the length of the parabolic section 14. With particular reference to FIGS. 2 and 4, the rear of the reflector 10 (adjacent the focal axis 17) is configured as an open slot to receive and align the array of high-output LEDs 42 with the focal axis 17. As is best seen in FIGS. 1 and 2, one end of the reflector 10 is configured in the form of a parabolic dish end 12. Such a dish end 12 will have a concave surface that defines a portion of a paraboloid of revolution about an axis. The axis of this paraboloid of revolution will orthogonally pass through the focal axis 17 defined by the linear parabolic section 14 and, in the illustrated embodiment, generally coincide with the optical axis A of the LED adjacent the dish end 12.

An opposite end 18 of the reflector is open. The open end 18 may be aligned and fixed to the open end of additional LED light assemblies to form an extended length light assembly. Alternatively, the open end 18 may remain open to provide improved wide-angle visibility from the LED light assembly by permitting light to escape without being redirected. Such wide-angle visibility is particularly useful in certain signaling and/or warning light applications.

Figure 9:
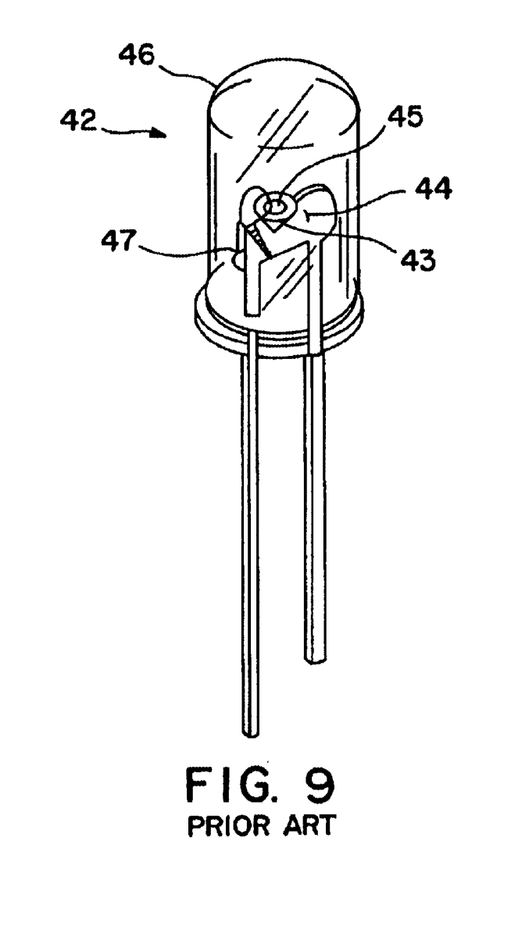
FIG. 9 is a perspective view illustrating the configuration of a typical 5 mm leaded LED.

FIG. 9 illustrates a typical 5 mm leaded LED. The LED itself is essentially a small chip (commonly referred to as a die) 45 typically arranged in a reflecting cup 43. The reflecting cup 43 may be supported on the cathode post of lead 44 as illustrated. An anode post or lead and wire connection complete the electrical circuit through the die 45. The die 45, cup, anode, cathode and connections are sealed within a plastic lens 46. The lens is typically an optical epoxy resin 46. Light is actually emitted from the die. The die is a confined point of light emission or a quasi-point source (hereinafter referred to as a "point source". Alignment of the point of light emission (in this case the LED die) is important to the overall efficiency of the LED light assembly 100.

Figure 9A:
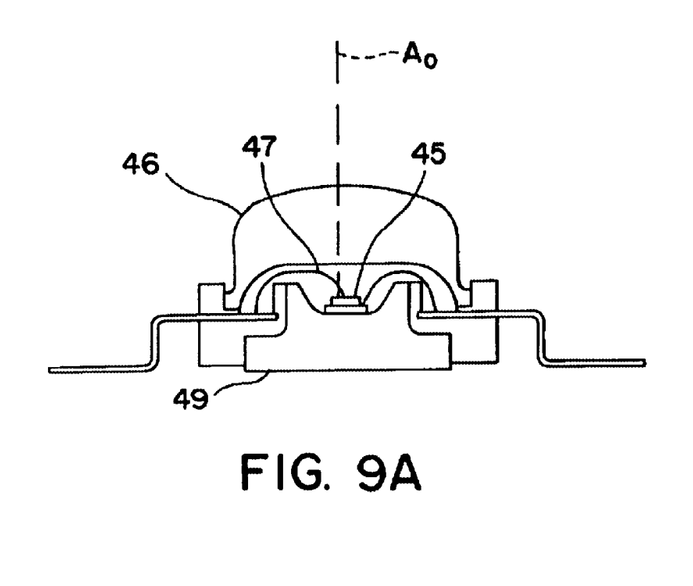
FIG. 9A is a sectional view through a Luxeon™ LED and its associated packaging.

FIG. 9A illustrates a new technology high flux LED, manufactured by LumiLeds Inc. This LED assembly is known in the art as a Luxeon™ emmitter. The LED die 46 is mounted on an integrated reflector cup and thermally conductive slug 49, and the anode and cathode connections are attached to the die 45 via bonded lead wires. Opto coupling silicon gel 47 is used to isolate the LED die 45 and lead wires from the optical epoxy wide angle lens 46. This new LED light source allows the heat produced from the die to be efficiently conducted out of the LED assembly through the slug 49. Efficient thermal transfer allows drive currents through the LED die 45 to be increased which result in greater light output.

FIG. 4 clearly illustrates that the PC board 40 is sandwiched or tightly compressed between the rear end of the reflector 10 and a conventional finned heat sink 50. This compressed relationship is maintained by fasteners 52 passing through the heat sink 50 and PC board 40 to engage fastener receptacles 16 molded in the reflector 10. A tightly compressed relationship enhances thermal transfer between the PC board 40 and the heat sink 50. Thermal transfer can further be enhanced by copper cladding on both sides of the PC board, copper-clad through holes and/or thermally conductive adhesives or materials disposed between the PC board and the heat sink. The slugs 49 of each LED are mounted to the PC board in such a manner as to enhance heat transfer from the slug to the copper cladding of the PC board. Although a conventional finned heat sink is illustrated, numerous heat absorption and transfer mechanisms are known in the art and may be appropriate for incorporation into an LED light assembly 100 in accordance with the present invention. Conducting heat away from the high output LEDs is important because overheating interferes with the efficient operation and seriously shortens the life of an LED as is known in the art.

Figure 7:
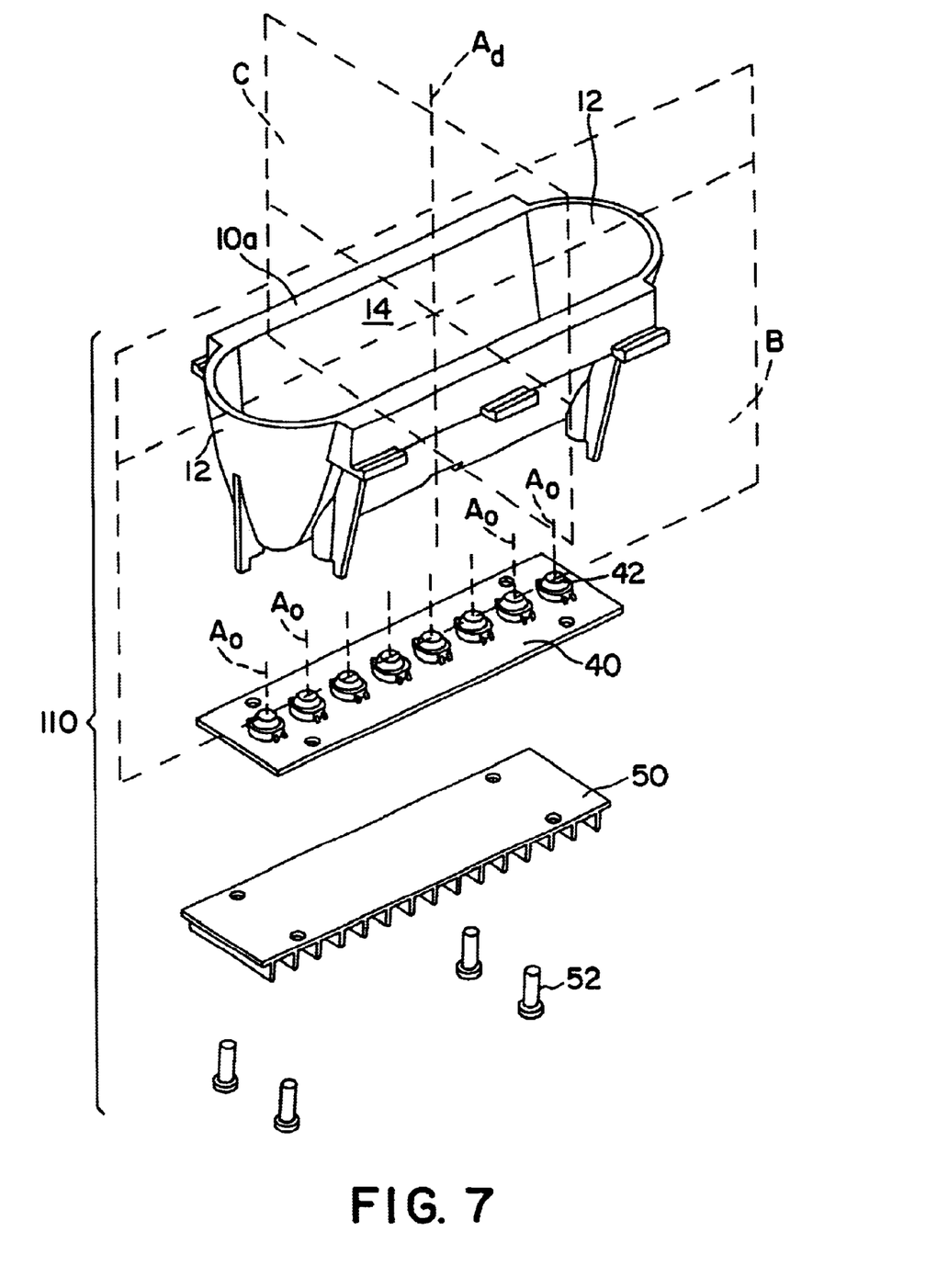
FIG. 7 is an exploded perspective view of an alternative LED light assembly in accordance with the present invention.

FIGS. 1 and 7 illustrate a linear array of LEDs mounted to a PC board in accordance with the present invention. The LEDs in the illustrated embodiments are mounted approximately 12 mm apart center to center. Center to center spacing of less than approximately 9 mm is difficult in view of the overall size of the chip package.

FIG. 4 also illustrates the reflector directional axis $A_d$ bisecting the reflector 10. The reflecting surface of the linear parabolic section is described by projecting a parabola P along the linear focal axis 17. The directional axis $A_d$ geometrically corresponds to a vertex axis of the parabola P. In other words, the directional axis $A_d$ bisects parabola P through the focus and vertex of the parabola P.

FIG. 7 illustrates an alternative LED light assembly 110 in which the linear parabolic reflector 10a is closed at both ends by parabolic dish ends 12 similar in configuration to the dish end 12 described with reference to the embodiment illustrated in FIGS. 1–6. It will be noted that the embodiment of FIG. 7 does not include the optional collimating lens 30 or its associated mounting grooves 15. As previously discussed, LEDs are primarily directional point light sources. The linear parabolic section 14 and associated parabolic dish ends 12 redirect "wide angle" light from the LEDs as previously discussed. Even without an optional collimating lens, the light output from the embodiment of FIG. 7 is organized into a wide angle beam and may be efficiently focused or directed in accordance with the needs of the lighting application.

With reference to FIG. 7, a directional axis $A_d$ of the reflector 10a is defined by the intersection of two planes C and B. Plane B bisects the reflector 10a longitudinally, while plane C bisects the reflector 10a perpendicular to plane B. LEDs 42 are arranged with their optical axes $A_o$ coincident with plane B. It will be understood that the reflector 10 and array of PC board mounted LEDs illustrated in FIGS. 1–6 share the symmetry and relationships illustrated in FIG. 7.

Figure 8:
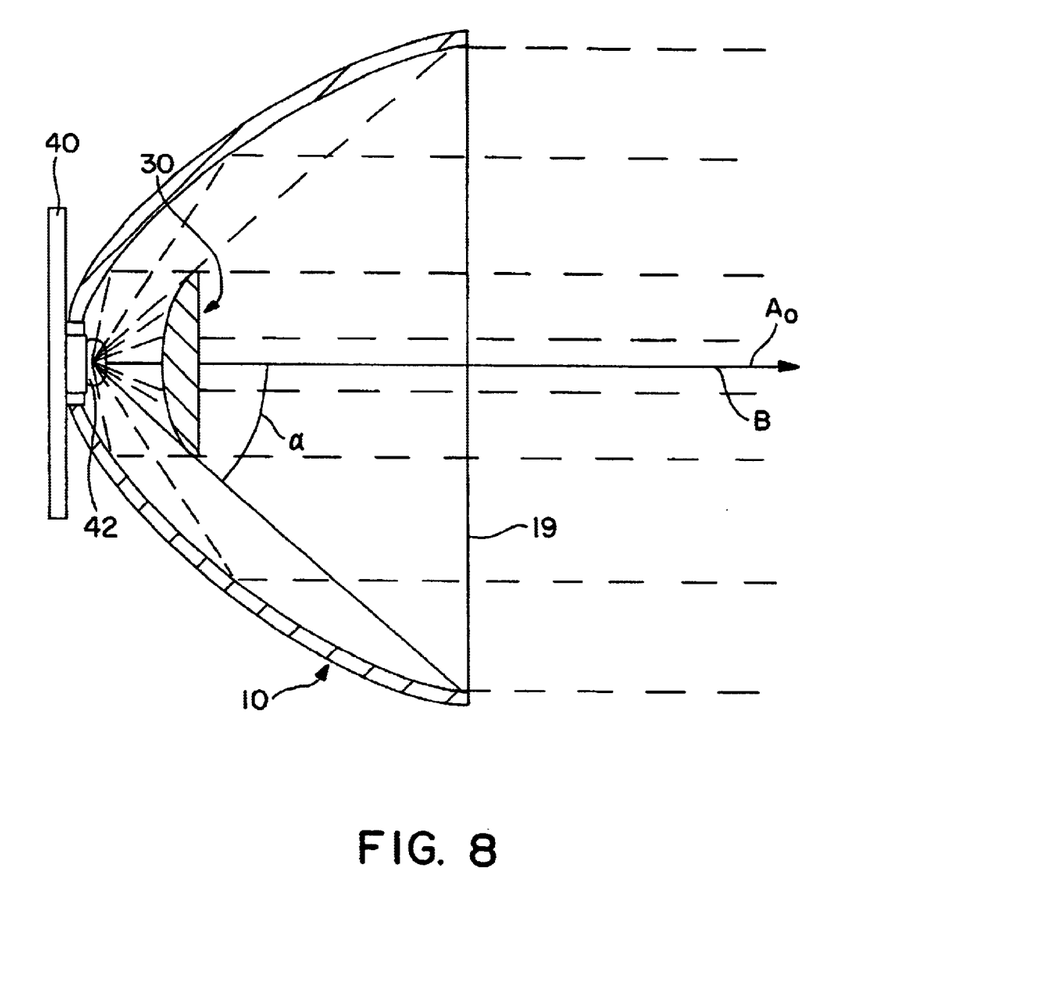
FIG. 8 is a sectional view through a representative LED light assembly in accordance with the present invention further including a schematic representation of light emitted therefrom.

FIG. 8 is a sectional view through a representative parabolic reflector 10 and associated PC board-mounted LED. The illustration of FIG. 8 includes an optional collimating lens 30. A significant portion of light from the LEDs is emitted within a narrow angle a from the LED optical axis A (optical axis A coincides with a plane B longitudinally bisecting the reflector 10). Some light is collimated and some is not when it emerges from the integral lens of the LED 42. In the illustrated configuration, substantially all of the light within angle will be captured and refracted before leaving the LED light assembly 100. Some light will escape an open ended reflector such as that illustrated in FIGS. 1–6. Small amounts of light passing through or around the lens 30 will not be collimated due to alignment errors and/or lens inefficiencies. Light emitted from the LEDs at an angle greater than angle , e.g., "wide angle" light, will be reflected from the parabolic reflector in a plane substantially parallel to plane B containing the LED optical axes $A_0$. Thus, it can be seen that, in accordance with the present invention, the LED light source, parabolic reflector and collimating lens provide a light assembly that produces a well organized, e.g., wide angle collimated light pattern. Such a wide angle collimated light pattern appears to the viewer as an area or band of light emission.

Figure 14:
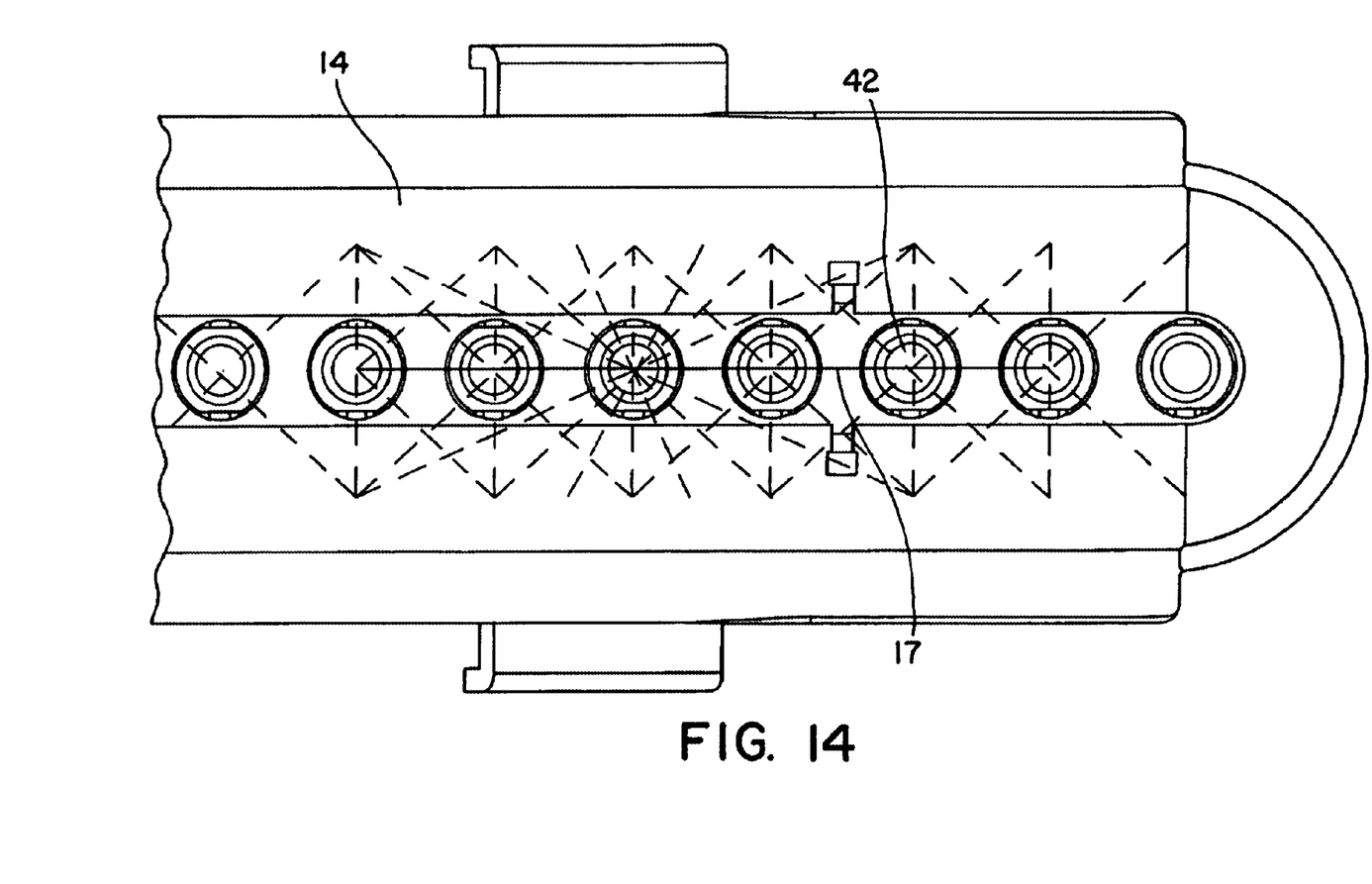
FIG. 14 is a partial enlarged view of the LED light assembly illustrated in FIG. 2.

FIG. 8 illustrates the behavior of light emitted generally perpendicular to the length of the LED light assembly. Luxeon™ LEDs are point light sources that emit light radially in a 360° pattern and axially in a 110° to 160° arc to produce the above mentioned "half globe". The illustrated preferred embodiment uses a low dome Luxeon™ emitter which produces a "batwing" light pattern about the optical axis. The open interior of the linear parabolic reflector permits the radial and axial light from adjacent LEDs to overlap as illustrated in FIG. 14. Thus, the light output of a plurality of point light source LEDs is effectively integrated and amplified into a continuous area or band of light. Testing has proven that such an area or band of light is more visible to the human eye than a distinct point of light, even if the point is several times more intense. The human eye is better able to retain a fix on the position of the larger light source as well as judge the distance to the light source.

Figure 10:
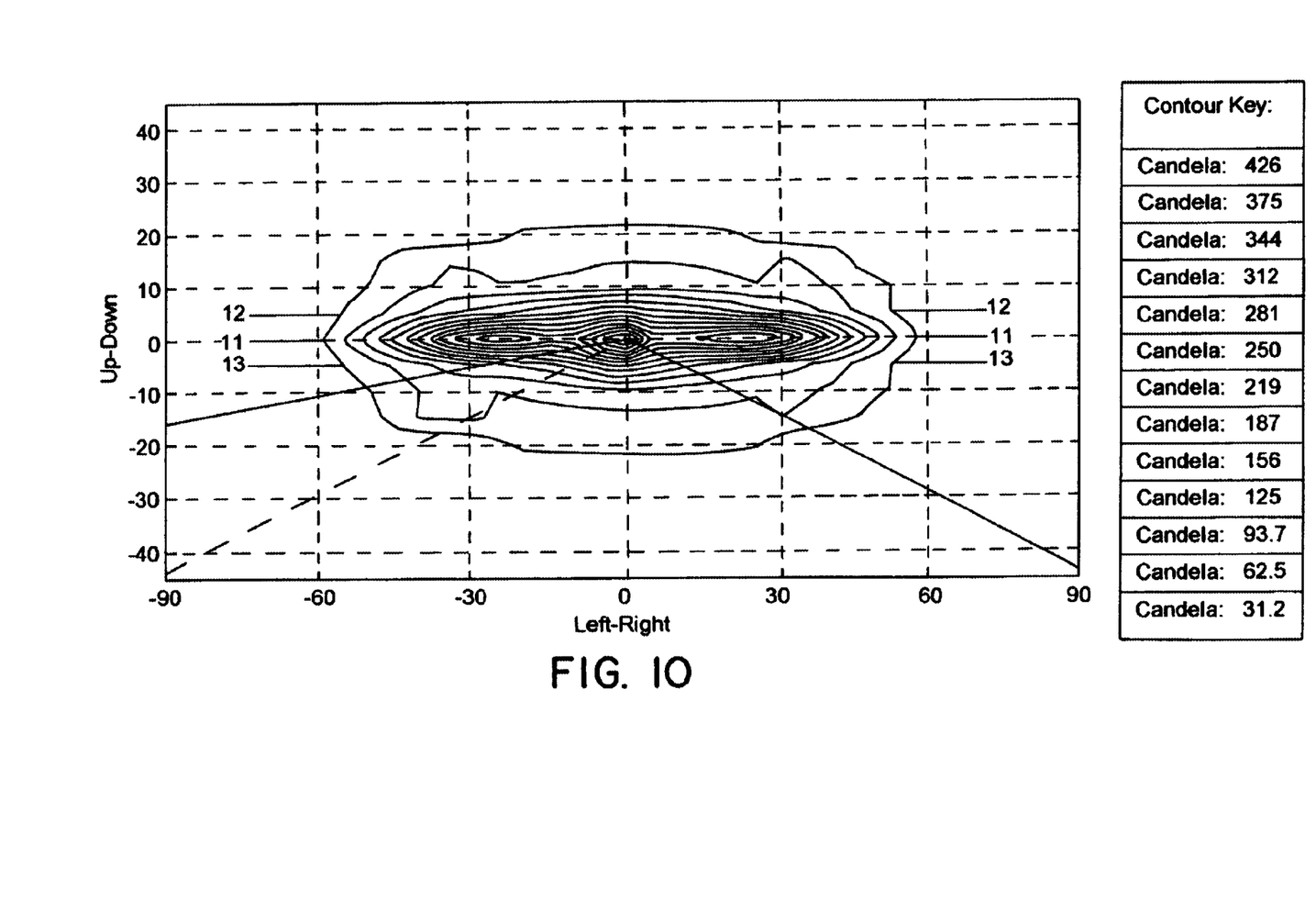
FIG. 10 is a graphical illustration of the light output of the LED light assembly illustrated in FIGS. 1–6.
Figure 11:
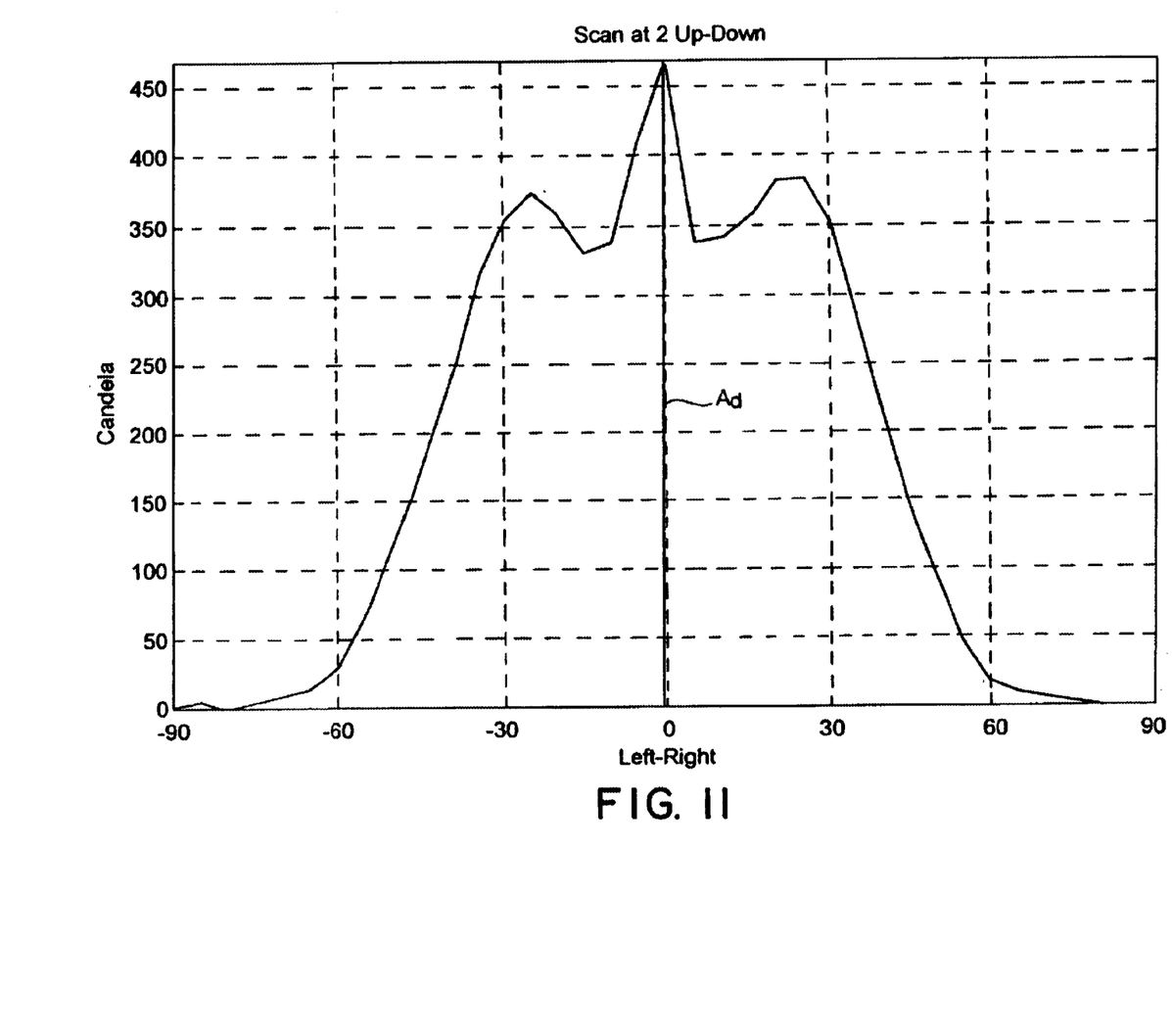
FIG. 11 is a graph of the light output illustrated in FIG. 10, taken along line 11—11 thereof.
Figure 12:
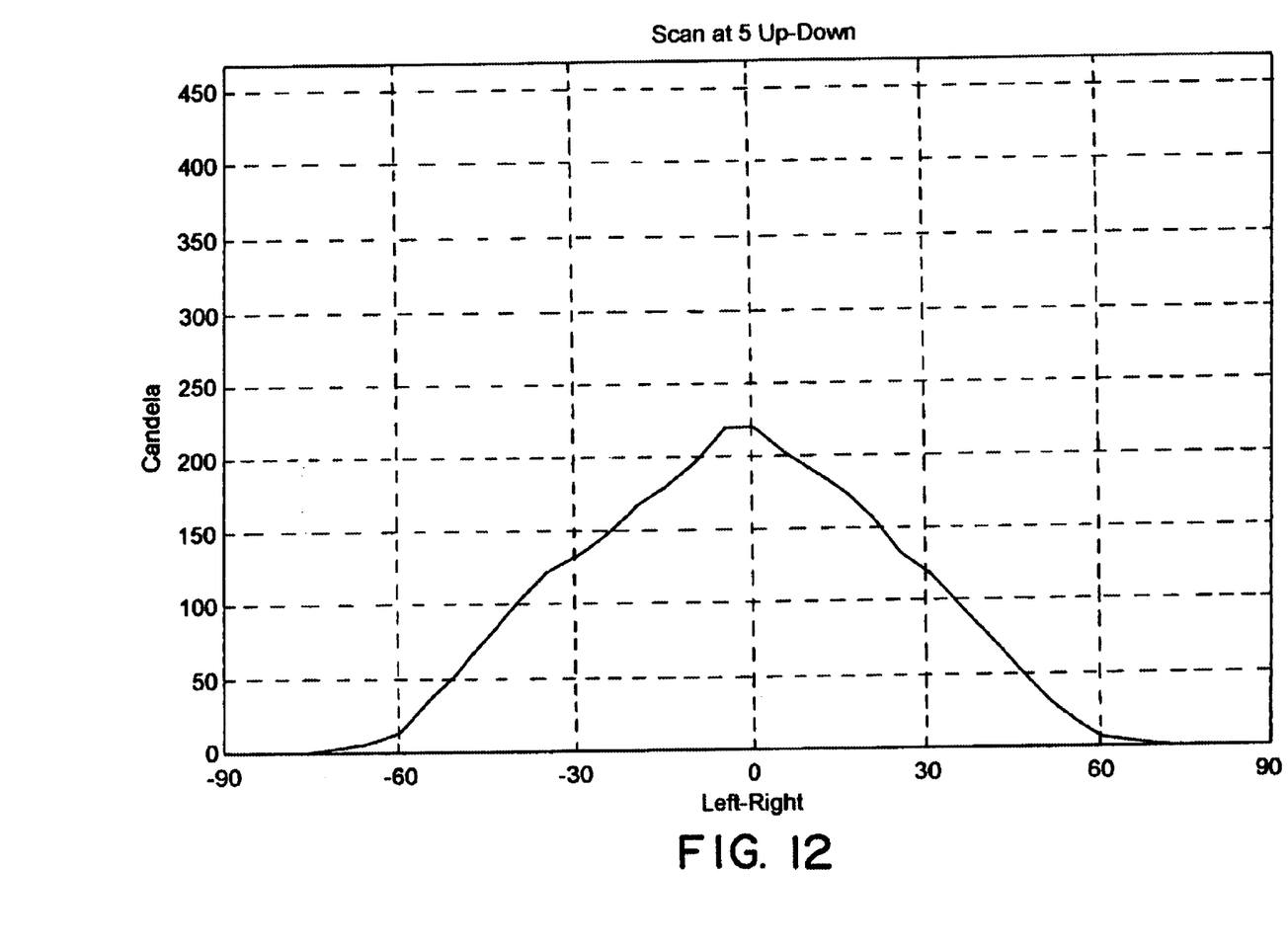
FIG. 12 is a graph of the light output illustrated in FIG. 10, taken along line 12—12 thereof.
Figure 13:
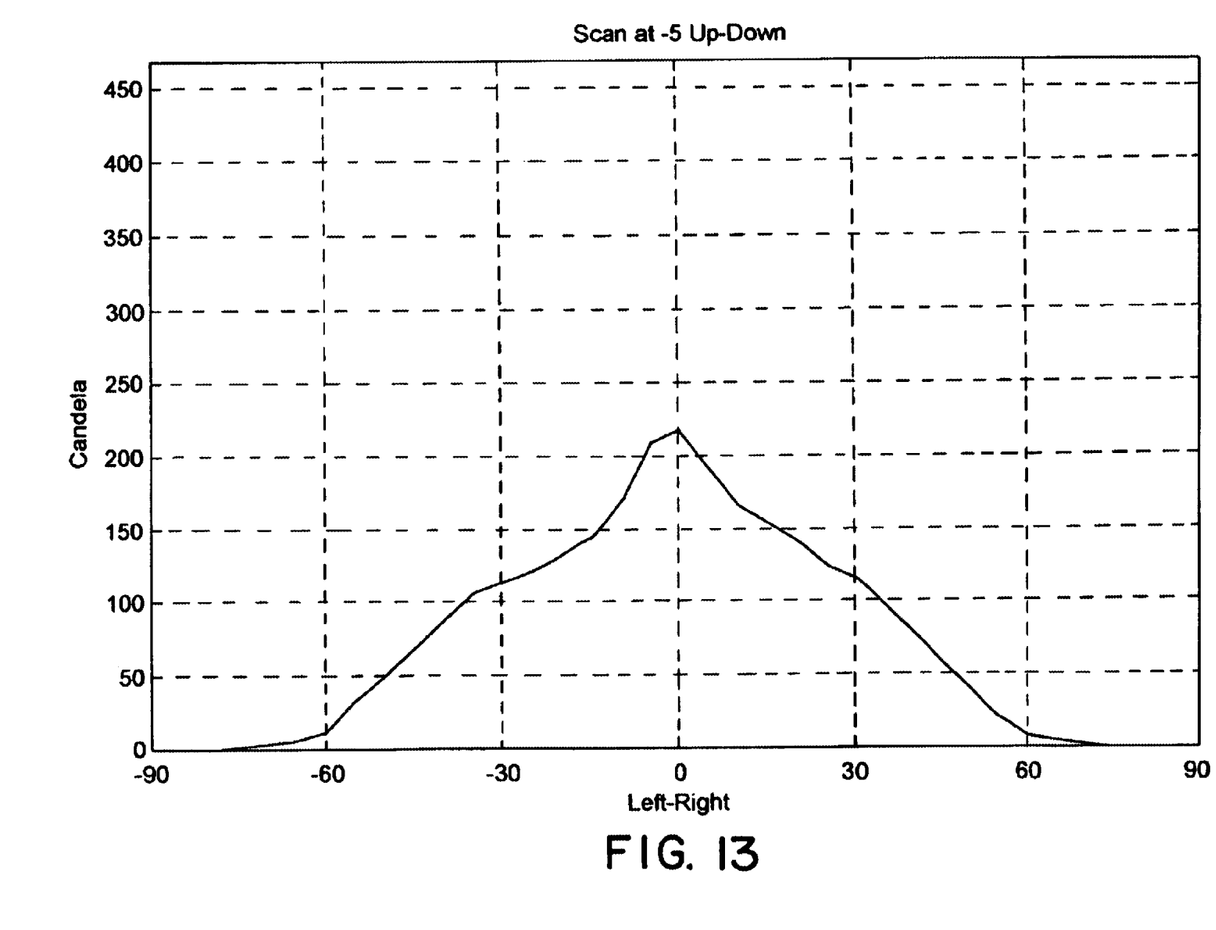
FIG. 13 is a graph of the light output illustrated in FIG. 10, taken along line 13—13 thereof.

FIGS. 10–13 graphically illustrate measurements of the light pattern produced by the LED light assembly embodiment illustrated in FIGS. 1–6. For the illustrated embodiment 12 LEDs, each having an intensity of approximately 8 candela along the optical axis. FIG. 10 is a straight-on view of the light pattern, where bands of decreasing light intensity radiate from the center of the light pattern. FIG. 10 illustrates the light pattern from 40° above the horizontal plane to 40° below the horizontal plane and 90° to the right and left of the directional axis of the LED light assembly. FIGS. 11, 12 and 13 isolate luminous intensity distributions ("slices") of the measurements illustrated in FIG. 10 in the 0° horizontal plane and horizontal planes 5° above and 5° below the 0° horizontal plane respectively. With reference to FIGS. 10 and 11, it can be seen that the light produced in the horizontal plane (coincident with plane B of FIG. 7) exceeds approximately 330 candela over an arc of 60° centered on the directional axis $A_d$ (30° left to 30° right of the directional axis $A_d$). The maximum light intensity at the center of the light pattern (along the directional axis $A_d$) is approximately 450 candela. As best seen in FIG. 10, the light pattern has an oval or wide angle configuration that is desirable for meeting many specified warning and signaling light standards.

While a conical reflector (or other reflector having axial symmetry aligned with the optical axis of the light source) might produce points of greater light intensity, these points will not typically be integrated into a large area of light emission or exhibit wide viewing angle properties. Further, conical reflectors tend to produce stray light that is effectively lost. An LED light source in accordance with the present invention captures more light and directs that light to contribute to the desired light pattern. Further, the light produced by a plurality of point source LEDs is integrated into a highly visible area of light emission.

It should be noted that a parabolic reflector may be configured to be very narrow, tall and steep or shallow and wide, depending on mathematical definition of the parabola used to define the reflecting surface. In a steep and narrow parabolic reflector, angle a will be correspondingly small as the reflector will capture and redirect a greater portion of the light emitted from the LEDs. In a broader, shallower parabola, angle α will be greater and an associated collimating lens 30 correspondingly wider to achieve the same functionality, i.e., light output in the form of a substantially collimated beam of parallel rays. The depth and configuration of the parabolic reflector will vary in accordance with design constraints and the requirements of the lighting application.

While preferred embodiments of the foregoing invention have been set forth for purposes of illustration, the foregoing description should not be deemed a limitation of the invention herein. Accordingly, various modifications, adaptations and alternatives may occur to one skilled in the art without departing from the spirit and the scope of the present invention.

What is claimed is:

1. A light assembly comprising:
   a parabolic reflector defining a reflecting cavity having a linear focal axis;
   a plurality of LEDs positioned in said cavity, each said LED having an optical axis; and
   a collimating lens mounted within said reflecting cavity, wherein the optical axis of each said LED intersects said linear focal axis passes through said collimating lens, said collimating lens arranged to collimate light emitted from said at least one LED that is not incident upon said reflecting surface while allowing light emitted from said at least one LED incident upon said reflecting surface to exit said light assembly without further change of direction after reflection from said reflecting surface.

2. The light assembly of claim 1, wherein said parabolic reflector comprises a linear parabolic reflecting surface, said linear focal axis is defined by said reflecting surface and said LEDs are configured in a linear array.

3. The light assembly of claim 1, wherein each said LED comprises a die substantially defining a point source of light emission, said parabolic reflector comprises a linear parabolic section defining said linear focal axis and said LEDs are arranged such that said linear focal axis passes through their respective point sources of light emission.

4. The light assembly of claim 1, wherein said parabolic reflector comprises a linear parabolic section defining said linear focal axis and at least one parabolic dish end.

5. The light assembly of claim 4, wherein said linear parabolic section defines a concave reflecting surface described by a parabola projected along said linear focal axis and said parabolic dish end comprises a reflecting surface described by partial rotation of said parabola about a vertex axis of said parabola.

6. The light assembly of claim 1, wherein each said LED comprises a die mounted to a thermally conductive slug.

7. The light assembly of claim 6, wherein each said LED is mounted with its slug thermally coupled to a first side of a PC board and said light assembly comprises a heat sink, said PC board and heat sink being mounted to said reflector such that said heat sink substantially covers a second side of said PC board.

8. The light assembly of claim 7, wherein each said LED emits heat which traverses through said slug and said PC board comprises heat transfer means for transferring said heat to said heat sink.

9. The light assembly of claim 1, wherein said reflector comprises a linear parabolic section and opposed parabolic dish ends.

10. The light assembly of claim 1, wherein said collimating lens has a periphery in a plane perpendicular to said optical axes and said periphery is spaced apart from said reflecting surface.

11. The light assembly of claim 1, wherein said collimating lens comprises a convex lens surface facing said LEDs and a flat lens surface opposite said convex lens surface.

12. A light assembly comprising:
    a reflector comprising a concave reflecting surface defining a reflecting cavity, said reflecting surface flaring from an inner vertex to an open outer end, said reflecting surface being symmetrical to a plane through said vertex;

at least one light emitting diode having an optical axis and disposed in said reflecting cavity such that said optical axis is generally coincident with said plane; and a collimating lens mounted within said reflecting cavity, wherein said collimating lens is configured to collimate substantially all light output from said at least one LED that is not incident upon said reflecting surface without altering the direction of light emitted from said at least one LED reflected by said reflecting surface.

13. The light assembly of claim 12, wherein said reflecting surface is described by rotating a parabola around an axis bisecting the parabola.

14. The light assembly of claim 12, wherein said reflecting surface comprises a linear parabolic section defining a linear focal axis generally coincident with said plane and said at least one light emitting diode comprises a plurality of light emitting diodes arranged in a linear array with their optical axes orthogonally intersecting said linear focal axis and generally coincident with said plane.

15. The light assembly of claim 14, wherein said linear parabolic section comprises at least one parabolic dish end.

16. The light assembly of claim 14, wherein each said light emitting diode comprises a die substantially defining a point source of light emission and said linear focal axis passes through each said point of light emission.

17. The light assembly of claim 12, wherein said reflecting surface defines a focal axis and said at least one light emitting diode comprises a die substantially defining a point source of light emission generally coincident with said focal axis.

18. The light assembly of claim 12, wherein said collimating lens has a periphery in a plane perpendicular to said optical axes and said periphery is spaced apart from said reflecting surface in said plane.

19. A light assembly comprising:

an elongated concave reflector extending a first longitudinal span and having a linear focal axis; and a linear array of LEDs, each said LED having an optical axis and a light output on said optical axis of a first luminous intensity, wherein the optical axes of said LEDs substantially intersect said focal axis in orthogonal relationship thereto, the reflector integrates the light output of said array of LEDs into a band of illumination extending the longitudinal span of said reflector, said reflector defines a central directional axis and said band of illumination has a continuous second luminous intensity distribution measured in a horizontal plane passing through said linear focal axis, each point of said second luminous intensity distribution exceeding three times the sum of the first intensities over an arc of 30 degrees to either side of said directional axis in said horizontal plane.

20. The light assembly of claim 19, wherein said band of illumination has a continuous third luminous intensity distribution measured in a vertical plane perpendicular to said horizontal plane and intersecting said horizontal plane along said directional axis, each point of said third luminous intensity distribution exceeding twice the sum of the first intensities over an arc of 5 degrees above and below said directional axis in said vertical plane.

21. The light assembly of claim 19, wherein said band of illumination has a peak luminous intensity measured along the directional axis which exceeds four times the sum of said first luminous intensities.

22. The light assembly of claim 19, wherein said reflector defines a reflecting cavity and the light output of each LED at least partially overlaps the light output of at least one other LED within said reflecting cavity.

23. The light assembly of claim 19, wherein each said LED has a viewing angle in excess of 100 degrees.

* * * * *

UNITED STATES PATENT AND TRADEMARK OFFICE
CERTIFICATE OF CORRECTION

PATENT NO. : 6,641,284 B2
DATED : November 4, 2003
INVENTOR(S) : Stopa et al.

It is certified that error appears in the above-identified patent and that said Letters Patent is hereby corrected as shown below:

Column 8,
Line 16, after "axis" insert -- and --.

Signed and Sealed this

Fifteenth Day of March, 2005

JON W. DUDAS
*Director of the United States Patent and Trademark Office*